US006984332B2

(12) United States Patent
Varadan et al.

(10) Patent No.: US 6,984,332 B2
(45) Date of Patent: Jan. 10, 2006

(54) METHOD FOR MAKING A MICRO-ELECTRO-MECHANICAL GYROSCOPE

(75) Inventors: Vijay K. Varadan, State College, PA (US); Pascal B Xavier, Singapore (SG); William D. Suh, State College, PA (US); Jose A Kollakompil, State College, PA (US); Vasundara V Varadan, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 285 days.

(21) Appl. No.: 10/309,566

(22) Filed: Dec. 4, 2002

(65) Prior Publication Data

US 2003/0167841 A1    Sep. 11, 2003

Related U.S. Application Data

(62) Division of application No. 09/594,370, filed on Jun. 15, 2000, now Pat. No. 6,516,665.

(60) Provisional application No. 60/139,609, filed on Jun. 17, 1999, provisional application No. 60/172,475, filed on Dec. 17, 1999.

(51) Int. Cl.
*H01L 21/00* (2006.01)
*G01P 3/00* (2006.01)

(52) U.S. Cl. .............................. 216/2; 216/41; 216/66; 73/504.01; 310/313 A (58) Field of Classification Search .................... 216/2, 216/41, 66; 73/504.01; 310/313 A
See application file for complete search history.

(56) References Cited

U.S. PATENT DOCUMENTS

| | | | | | |
|---|---|---|---|---|---|
| 5,653,939 | A | * | 8/1997 | Hollis et al. | 422/50 |
| 5,725,729 | A | * | 3/1998 | Greiff | 438/50 |
| 5,731,246 | A | * | 3/1998 | Bakeman et al. | 438/770 |
| 5,929,723 | A | * | 7/1999 | Kimura et al. | 333/193 |

FOREIGN PATENT DOCUMENTS

JP    8-334330    * 12/1996

* cited by examiner

*Primary Examiner*—Shamim Ahmed
(74) *Attorney, Agent, or Firm*—Ohlandt, Greeley, Ruggiero&Perle L.L.P.

(57) ABSTRACT

A gyroscope comprises a piezoelectric substrate having a surface. Disposed on the surface are a resonator transducer, a pair of reflectors, a structure such as a metallic dot, and a sensor transducer. The resonator transducer creates a first surface acoustic wave on the surface. The pair of reflectors reflects the first surface acoustic wave to form a standing wave within a region of the surface between the pair of reflectors. The structure is disposed on the surface within the region, wherein a Coriolis force acting upon the structure creates a second surface acoustic wave. The sensor senses the second surface acoustic wave and provides an output indicative thereof.

5 Claims, 9 Drawing Sheets

METHOD FOR MAKING A MICRO-ELECTRO-MECHANICAL GYROSCOPE

CLAIM OF PRIORITY FROM COPENDING PROVISIONAL APPLICATIONS

This is a division of application Ser. No. 09/594,370, filed Jun. 15, 2000, U.S. Pat. No. 6,516,665, which claims priority from provisional application Ser. No. 60/139,609 filed on Jun. 17, 1999 and provisional application Ser. No. 60/172,475 filed on Dec. 17, 1999.

BACKGROUND OF THE INVENTION

1. Field of the Invention

The present invention relates to gyroscopes, and more particularly, to a micro-electro-mechanical (MEM) gyroscope fabricated on a piezoelectric substrate.

2. Description of the Prior Art

An emergence of new consumer and automotive products that require angular velocity information has created an increasing demand for a smaller and inexpensive gyroscope or angular rate sensor. Rotating wheel gyroscopes, fiber optic gyroscopes and ring laser gyroscopes have been used extensively for inertial navigation and guidance systems; however, these gyroscopes are too bulky and expensive for newly emerging applications. A smaller and less expensive gyroscope is required for applications such as (i) automotive safety products, e.g., anti-skid system, ABS, airbag system, (ii) consumer products, e.g., 3-D pointer, camcorder, global positioning systems, sports equipment, (iii) industrial products, e.g., robots, machine control, guided vehicles, (iv) medical products, e.g., wheel-chairs, surgical tools, body movement monitoring, and (v) military products, e.g., smart ammunition, new weapon systens. A micri-electro-mechanical (MEM) sensor generally offers advantages of lightweight, small size, low power consumption, and low cost, particulary when manufactured using standard IC-fabrication techniques.

For any mechanical gyroscope, there is a stable reference vibrating motion (V) of a mass (m) such that an angular rotation ($\Omega$) perpendicular to the direction of the vibrating motion (V) causes a Coriolis force perpendicular to the directions of both the vibrating motion (V) and the angular rotation ($\Omega$), at the frequency of the vibrating motion (V). Therefore, the effect of the Coriolis force $$F = 2 \cdot m \cdot V \times \Omega$$

is a measure of the rate of the angular rotation ($\Omega$).

A mass constrained by a stiffness element in a frame can be placed into an oscillatory motion in a z-direction by an input power source. If the frame is rotated about an x-axis, the oscillatory mass will experience a Coriolis force, in a y-direction, proportional to the applied rate of rotation. The Coriolis force acting on the mass attempts to cause a displacement of the mass in the y-direction proportional to the rate of rotation.

A conventional MEM gyroscope is a silicon-based vibratory sensor that utilizes an energy transfer between two vibrating modes of a mechanical structure. To achieve high sensitivity when subjected to a rotation, the energy from the vibrating modes must be efficiently transferred at a high Q level from an exciting direction to a sensing direction. A considerable effort is required to design and fabricate the vibrating structure and its support electronics to achieve a resolution of less than one degree per second.

Conventional MEM gyroscopes suffer from an inherent performance limitation because of their underlying operating principle, which is based on a vibration of a suspended mechanical structure, i.e., a comb structure, a beam, a disk, or a ring structure. It is often difficult and expensive to design and fabricate a mechanical structure with matching resonant frequencies of the two vibrating modes. The cost of the final product may also increase due to a need for electronic circuitry for controlling and detecting the status of the vibrating structure in order to improve dynamic range. In addition, the suspended vibrating mechanical structure is susceptible to external shock and vibration that occurs at frequencies not far removed from the frequency at which the gyroscope operates. Such disturbances can influence the vibrating structure. Consequently, the structure cannot be rigidly attached to the substrate for its resonant vibration, thereby also limiting its dynamic range.

For example, in a vibratory gyroscope such as a tuning fork gyroscope, the tuning fork consists of two tines connected to a junction bar. In operation, the tines vibrate at a designed frequency. When the tuning fork is subjected to rotation at its sensitive axis, a Coriolis force causes an orthogonal vibration. The Coriolis force can be detected from a differential bending of the tines. The tines and the vibrating structures are susceptible to external shock and vibration that occurs at frequencies close to the tine vibration frequency. Such disturbances can influence the vibrating structure and produce erroneous results. This is a major draw back of a vibrating gyroscope.

U.S. Pat. No. 6,003,370 to Yukawa et al. (hereinafter "the Yukawa et al. patent"), entitled ELASTIC SURFACE WAVE GYROSCOPE, relates to an elastic surface wave gyroscope for detecting a Coriolis force generated on the surface of a piezoelectric substrate by the interaction of a surface oscillation caused by an elastic surface wave of the piezoelectric substrate and a rotary motion of the piezoelectric substrate. Two transducers on a piezoelectric substrate generate two elastic surface waves of different frequencies. Two pairs of reflectors for reflecting the two elastic surface waves produce two different standing waves. The two standing waves interfere with one another and produce an interference wave adapted for detecting the Coriolis force. Another pair of transducers fixed between the first two transducers will detect waves produced by the Coriolis force.

One disadvantage of the gyroscope of the Yukawa et al. patent is its susceptibility to cross coupling between the frequencies of the first two transducers. One technique for reducing cross coupling is to design the transducers to operate in a very narrow frequency band. Narrow band operation can be achieved by using a large number of IDTs, but unfortunately this increases the size of the gyroscope. Another alternative is to design the two transducers to operate with a very large difference in frequency. However, one transducer may be susceptible to harmonics of the frequency of the other transducer. For example if the devices are designed for 40 MHz and 80 MHz, then the 80 MHz device will receive the 40 MHz frequency because its harmonic frequencies are 80 MHz, 120 MHz, 160 MHz . . . and so on.

Another disadvantage of the gyroscope of the Yukawa et al. patent involves the arrangement of the third transducer between the first two. The third transducer can receive harmonic frequencies from the first two transducers and produce a high output signal even without rotating. Also, during operation of the gyroscope, the signal due to rotation will be small and difficult to detect in the presence of the first and the second classic surface waves.

SUMMARY OF THE INVENTION

It is an object of the present invention to provide a gyroscope with an improved capability for sensing a Coriolis force.

It is another object of the present invention to provide such a gyroscope that is inherently shock-resistant.

It is a further object of the present invention to provide such a gyroscope that is manufactured by a standard integrated circuit fabrication technique.

These and other objects of the present invention are achieved by a gyroscope that includes a piezoelectric substrate having a surface; a resonator transducer disposed on the surface, for creating a first surface acoustic wave on the surface; a pair of reflectors disposed on the surface, for reflecting the first surface acoustic wave to form a standing wave within a region of the surface between the pair of reflectors; a structure disposed on the surface within the region, wherein a Coriolis force acting upon the structure creates a second surface acoustic wave; and a sensor transducer disposed on the surface orthogonally to the pair of reflectors, for sensing the second surface acoustic wave.

A gyroscope in accordance with the present invention is a micro-electro-mechanical (MEM) gyroscope that utilizes a surface acoustic wave resonator (SAWR) and a surface acoustic wave sensor (SAWS). The SAWR and the SAWS are orthogonal to one another on a piezoelectric substrate, with a plurality of metallic dots arranged in an array therebetween. The metallic dots, which serve as a proof mass, are subjected to a reference vibration for detecting a Coriolis force. Experimental observations show that the sensitivity of the gyroscope is significantly improved by the presence of the metallic dot array. Since the SAWS are orthogonal to the SAWR, the SAWS directly receive only a relatively small portion of the signal generated by the SAWR, and accordingly, the surface wave produced by the Coriolis force can be easily detected. Also, the SAWR and SAWS operate at the same frequency, and thus one will not be adversely affect by the harmonic frequencies of the other.

A gyroscope in accordance with the present invention can be operated as a wireless gyroscope, or more precisely a passive gyroscope, for which a local power source is not necessary. An antenna attached to the gyroscope receives an RF signal, which is coupled to a microstrip duplexer, and thereafter to the resonator IDT to initiate an oscillation thereof. The resonator IDT converts the RF signal to first surface acoustic wave that is reflected between a pair of reflectors, thus forming a standing wave. Metallic dots at the anti-nodes of the standing wave are subject to an oscillation, which is used as a reference vibration for the gyroscope. When this gyroscope is subjected to rotation, a second surface acoustic wave will be generated with same frequency as the first surface acoustic wave and will propagate towards the sensor IDT. An output from the sensor IDT is coupled to the microstrip duplexer, and thereafter to the antenna for transmission to an external device that will process the signal to characterize the Coriolis force.

Also in accordance with the present invention, the gyroscope can offer greater sensitivity by providing a differential signal. That is, the gyroscope provides a first signal representing the effect of the Coriolis force on an array of metallic dots, and a second signal representing the effect of the Coriolis force on a region of the gyroscope that does not include the array of metallic dots. The difference between the signals is processed to characterize the Coriolis force.

DESCRIPTION OF THE INVENTION

The present invention relates to a micro-electro-mechanical (MEM) gyroscope utilizing a surface acoustic wave (SAW) on a piezoelectric substrate, and more particularly to a combination of surface acoustic wave resonator (SAWR) and surface acoustic wave sensor (SAWS) technologies.

In accordance with the present invention, a first interdigital transducer (IDT) functioning as a resonator creates a SAW on a surface of a piezoelectric substrate. The SAW propagates back and forth between a pair of reflectors and forms a standing wave within a region of the surface between the reflectors. A number of structures, e.g., metallic dots, are located within the region at anti-nodes of the standing wave. The structures experience a vibration perpendicular to the plane of the substrate, and the vibrating structures provide a reference vibrating motion for the gyroscope. When the substrate is rotated, the vibrating structures are subjected to a Coriolis force that generates a second surface acoustic wave. The phases of the second surface acoustic wave are added to one another thus yielding an amplification of the second surface acoustic wave. The second surface acoustic wave propagates toward, and is sensed by, a second IDT disposed on the surface orthogonally to the resonator IDT.

The MEM gyroscope is well suited for operation with SAW frequencies ranging from 1 MHz through 5 GHz. A version of the MEM gyroscope, fabricated on a piezoelectric substrate, was designed to operate at 74.2 MHz. That is, the resonator IDT generates a surface acoustic wave having a frequency of 74.2 MHz. The performance of the 74.2 MHz version was evaluated using a geophone and rate table setups, and indicated a very high sensitivity and dynamic range, which are ideal for commercial applications. The gyroscope has a planar configuration with no suspended resonating mechanical structures, and it is thereby inherently robust and shock-resistant. In view of its one-layer planar configuration, the gyroscope can easily be implemented in an area of 1 cm×1 cm, and readily lends itself to applications requiring conformal mounting of the gyroscope onto another surface.

Figure 1:
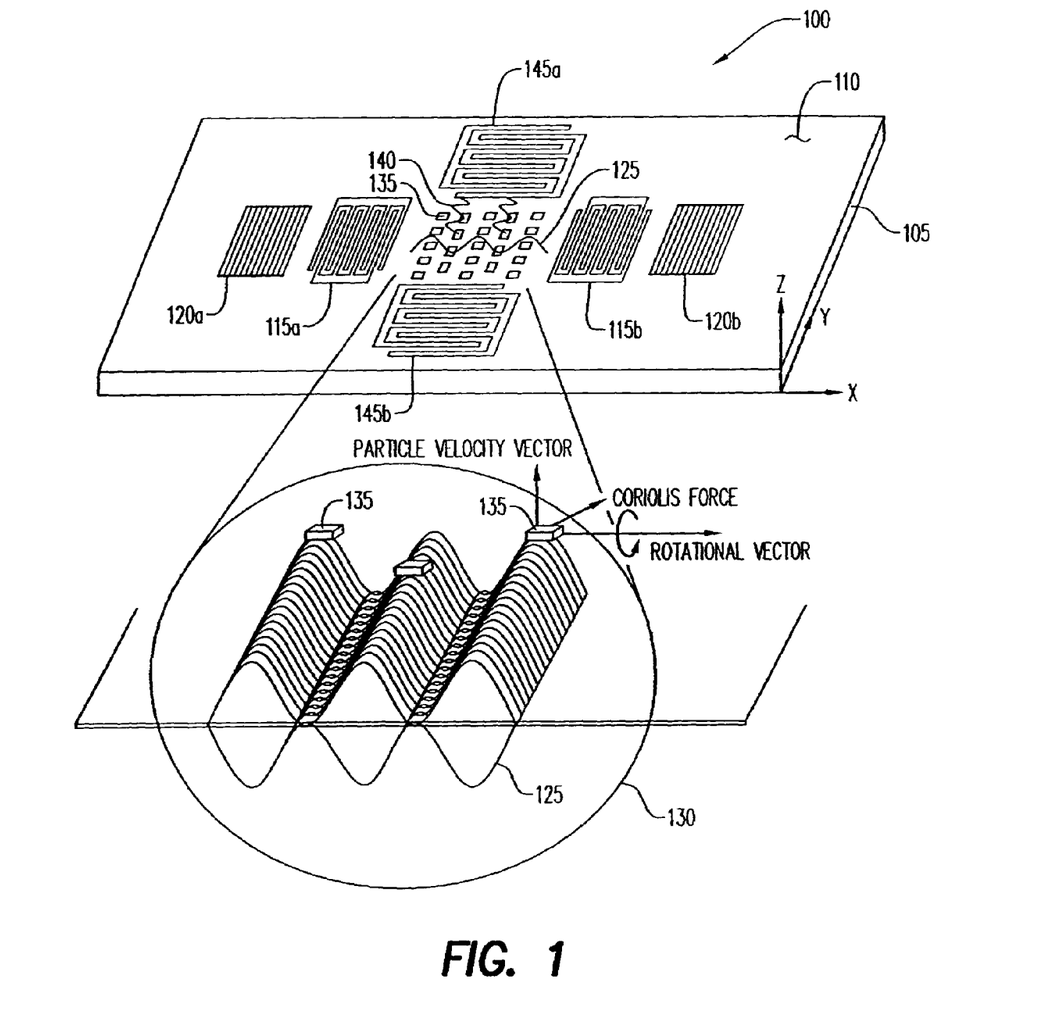
FIG. 1 is a diagram of a gyroscope according to the present invention.

FIG. 1 is a diagram of a gyroscope 100 according to the present invention. Gyroscope 100 is an integration of a SAWR and a SAWS, where the SAWR is used for exciting a stable reference vibrating motion and the SAWS is used for the detection of the Coriolis force and, hence, a rotation of gyroscope 100 about its sensitive axis. As shown in FIG. 1, gyroscope 100 includes a piezoelectric substrate 105, a pair of resonator transducers 115(a,b), a pair of reflectors 120(a,b), at least one, and preferably a plurality of, structures such as metallic dots 135, and a pair of sensory transducers 145(a,b).

The piezoelectric substrate 105 has a surface 110 upon which the other components of gyroscope 100 are disposed. Surface 110 is preferably, but not by way of limitation, a planar surface. Piezoelectric substrate 105 can be any piezoelectric material, including but not limited to, lithium niobate, lithium tantalate, lithium tetraborate, quartz, silicon, zinc oxide, zinc oxide film on a silicon substrate, diamond, and combinations thereof.

The pair of resonator transducers 115(a,b) is disposed on surface 110 for creating a first surface acoustic wave on surface 110. More particularly, the pair of resonator transducers 115(a,b) creates an electrical potential on substrate 105, and substrate 105 converts the electrical potential into mechanical energy, thus forming the first surface acoustic wave. Gyroscope 100 functions adequately with a single resonator transducer, e.g., 115a, however, when the pair of resonator transducers 115(a,b) are used together, they produce an enhanced first surface acoustic wave of a greater magnitude than that produced by a single resonator transducer. As described in greater detail below, the resonator transducers 115(a,b) are IDTs that have fingers spaced apart with a periodicity of one half the wavelength of the first surface acoustic wave.

The pair of reflectors 120(a,b) is disposed on surface 110 for reflecting the first surface acoustic wave to form a standing wave 125 within a region 130 of surface 110, which is located between the pair of reflectors 120(a,b). The reflectors 120(a,b) are separated from each other by a distance that is an integral number of one half wavelengths of the first surface acoustic wave. Together, the resonator transducers 115(a,b) and the reflectors 120(a,b) function as a SAWR.

Metallic dot 135 is disposed on surface 110 within region 130. A Coriolis force acting upon metallic dot 135 creates a second surface acoustic wave 140. Assume a 3-dimensional coordinate system, preferably, but not by way of limitation, a Cartesian coordinate system, in which an x-axis, a y-axis and a z-axis are mutually orthogonal. If the first surface acoustic wave causes metallic dot 135 to oscillate along the z-axis, and substrate 105 is rotated about the x-axis, then the Coriolis force, which is related to the rate of rotation, is directed along the y-axis. In order to intensify the effect of the Coriolis force on metallic dot 135, metallic dot 135 is preferably located at an anti-node of standing wave 125 within region 130.

To further intensify the effect of the Coriolis force, metallic dot 135 is one of a plurality of metallic dots 135 disposed in an array within region 130. The first surface acoustic wave causes the plurality of metallic dots 135 to oscillate along the z-axis. As in the case of a single metallic dot 135, if substrate 105 is rotated about the x-axis, then the Coriolis force, which is related to the rate of rotation, is directed along the y-axis. Preferably, the array is located in the x-y plane such that the Coriolis force acting upon each of the plurality of metallic dots 135 creates a plurality of second surface acoustic waves 140 that are coherently added.

The pair of sensor transducers 145(a,b) is disposed on surface 110, separated from one another by region 130 and disposed orthogonally to the pair of resonator transducers 115(a,b), for sensing the second surface acoustic wave 140 and providing an output indicative of the characteristics of the second surface acoustic wave. Gyroscope 100 functions adequately with a single sensor transducer, e.g., 145a, however, when the pair of sensor transducers 145(a,b) are used together, their outputs may be added together, thus improving the sensitivity of gyroscope 100. The sensor transducers 145(a,b) function as a SAWS.

The following paragraphs describe some of the theoretical background and practical considerations of implementing gyroscope 100.

A working model of gyroscope 100 was fabricated through micro fabrication techniques on the surface of a piezoelectric substrate, 128° YX LiNbO3. The resonator transducers 115(a,b) create a SAW that propagates back and forth between reflectors 120(a,b) and forms a standing wave 125 in region 130 between resonator transducers 115(a,b) due to the collective reflection from reflectors 120(a,b). SAW reflection from individual metal stripes of reflectors 120(a,b) adds in phase if the periodicity of reflectors 120(a,b) is equal to half a wavelength of the SAW. For the established standing wave 125, a typical substrate particle, such as metallic dot 135, at the nodes of standing wave 125 has no amplitude of deformation in the z-direction. However, at or near the anti-nodes of standing wave 125, such particles will experience a larger amplitude of vibration in the z-direction, which serves as the reference vibrating motion for gyroscope 100.

In order to acoustically amplify the magnitude of the Coriolis force in phase, the metallic dots 135 are positioned strategically at the anti-node locations. The rotation ($\Omega$, x-direction) perpendicular to the velocity (V in ±z-direction) of the oscillating masses (m) of metallic dots 135 produces the Coriolis force (F=2·m·V×$\Omega$, in ±y-direction) in the direction perpendicular to both vectors. This Coriolis force establishes a SAW in the y-direction of the same frequency as the reference oscillation. The array of metallic dots 135 is located in the x-y plane such that the phases of the SAW due to the Coriolis forces add coherently. This generated SAW is detected by the sensor transducers 145(a,b).

Figure 2:
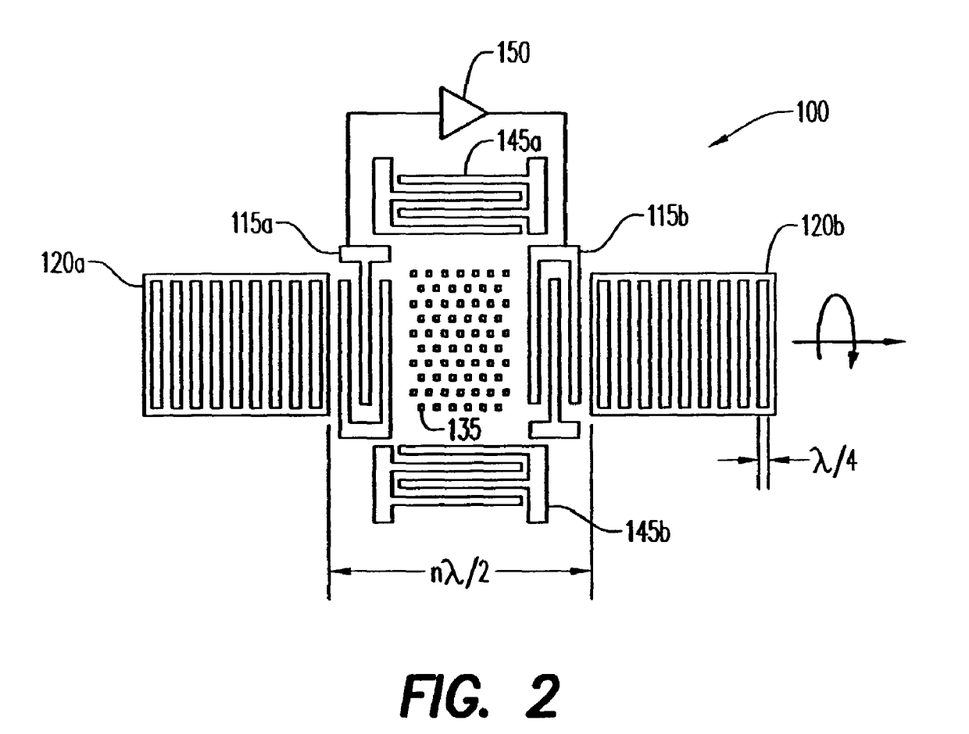
FIG. 2 is a diagram of a gyroscope according to the present invention, configured for operation with a local source of RF energy.

FIG. 2 is a simplified diagram of gyroscope 100, configured for operation with a local source of RF energy. As shown here, gyroscope 100 includes an amplifier/RF source 150 that initiates and maintains an oscillation of the resonator transducers 115(a,b). The operating frequency ($f_o$) of gyroscope 100 is determined by the separation of reflectors 120(a,b) and the periodicity of resonator transducers 115(a,b). The separation between reflectors 120(a,b) is an integral number of half wavelengths such that standing waves are created between reflectors 120(a,b). The periodicity of the resonator transducers 115(a,b) was chosen as a half wavelength ($\lambda/2$) of the SAW. Therefore, for a given material, the SAW velocity in the material and the desired operating frequency, $f_o$, define the periodicity of the IDT. The SAW velocity can be found from theoretical calculations of a free surface condition with a given material and a coordinate system.

It is assumed that the presence of the array of metallic dots 135 does not affect the SAW propagation velocities to a large extent. To determine the effective velocities of the waves in both the x and y directions, two narrow band IDT sets with the same periodicity were placed in x and y directions including the dot array in the middle. The wave velocity is different in x and y directions due to the anisotropy of 128° YX LiNbO$_3$. Hence, the frequency response measured using IDTs in x and y directions were different for the same periodicity of these IDT sets, and the velocities of both directions were found to be 3961 m/sec and 3656 m/sec, respectively. The differences between published values (3980~4000 m/s) and experimental results are mainly due to the effect of the array of metallic dots 135 and the metallic structure on the substrate. The size of the fingers of the resonator transducers 115($a,b$) and the sensor transducers 145($a,b$) and their spacing were designed according to the velocity of 3961 m/s and 3656 m/s in x and y directions, respectively.

In order to reduce the mass loading effect of the array of metallic dots 135 on the sensor operation, the size of each metallic dot 135 in the array is chosen such that it is sufficiently smaller than the wavelengths in both directions. However, there exists a tradeoff since a larger metallic dot 135 creates a greater Coriolis force. Also, a greater quantity of metallic dots 135 will produce a greater Coriolis effect.

Since the amplitudes of the standing waves 125 are dependent on material damping and electromechanical transduction loss, the resonator transducers 115($a,b$) and sensor transducers 145($a,b$) are placed such that they are located at the standing wave maxima in order to reduce transduction loss.

To optimize resonator performance with a high-coupling coefficient substrate, the aperture of the resonator transducers 115($a,b$) and its number of IDT fingers are minimized, but they are large enough to avoid acoustic beam diffraction. Also, the spacing between the resonator transducers 115($a, b$), see item K in FIG. 7, is great enough to avoid electromagnetic coupling between the IDTs.

Figure 7:
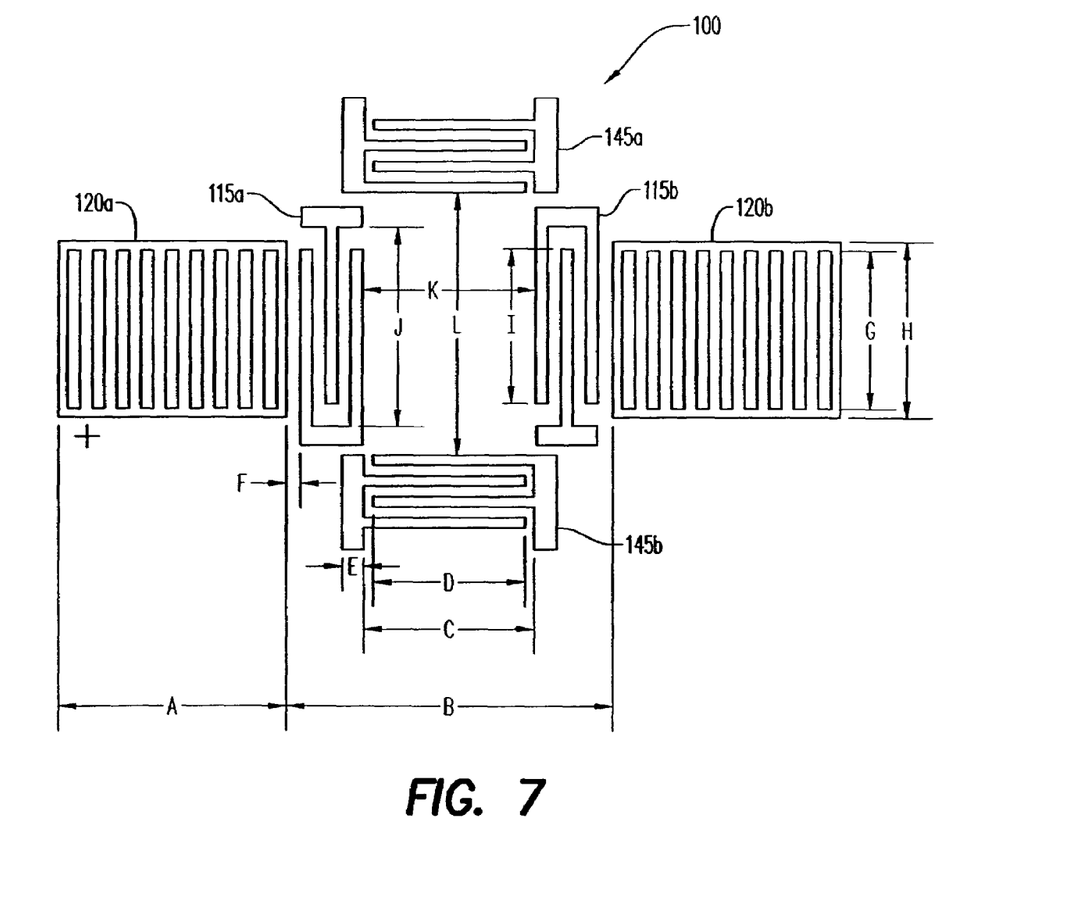
FIG. 7 is a diagram of a gyroscope according to the present invention, highlighting dimensions of selected features.

The electrical impedance of gyroscope 100 is determined by the number of resonator transducers 115($a,b$) and the number of sensor transducers 145($a,b$), the aperture separation between transducers, see items K and L in FIG. 7, the electromechanical coupling coefficient and dielectric permittivity of the substrate, and the frequency of operation. Also, impedance matching performed during packaging may use series inductors or transformers, as gyroscope 100 is largely capacitive due to the arrangement of the fingers of the resonator transducers 115($a,b$) and the sensor transducers 145($a,b$). The inductors or transformers match the impedance of gyroscope 100 to that of a measuring device.

Figure 3:
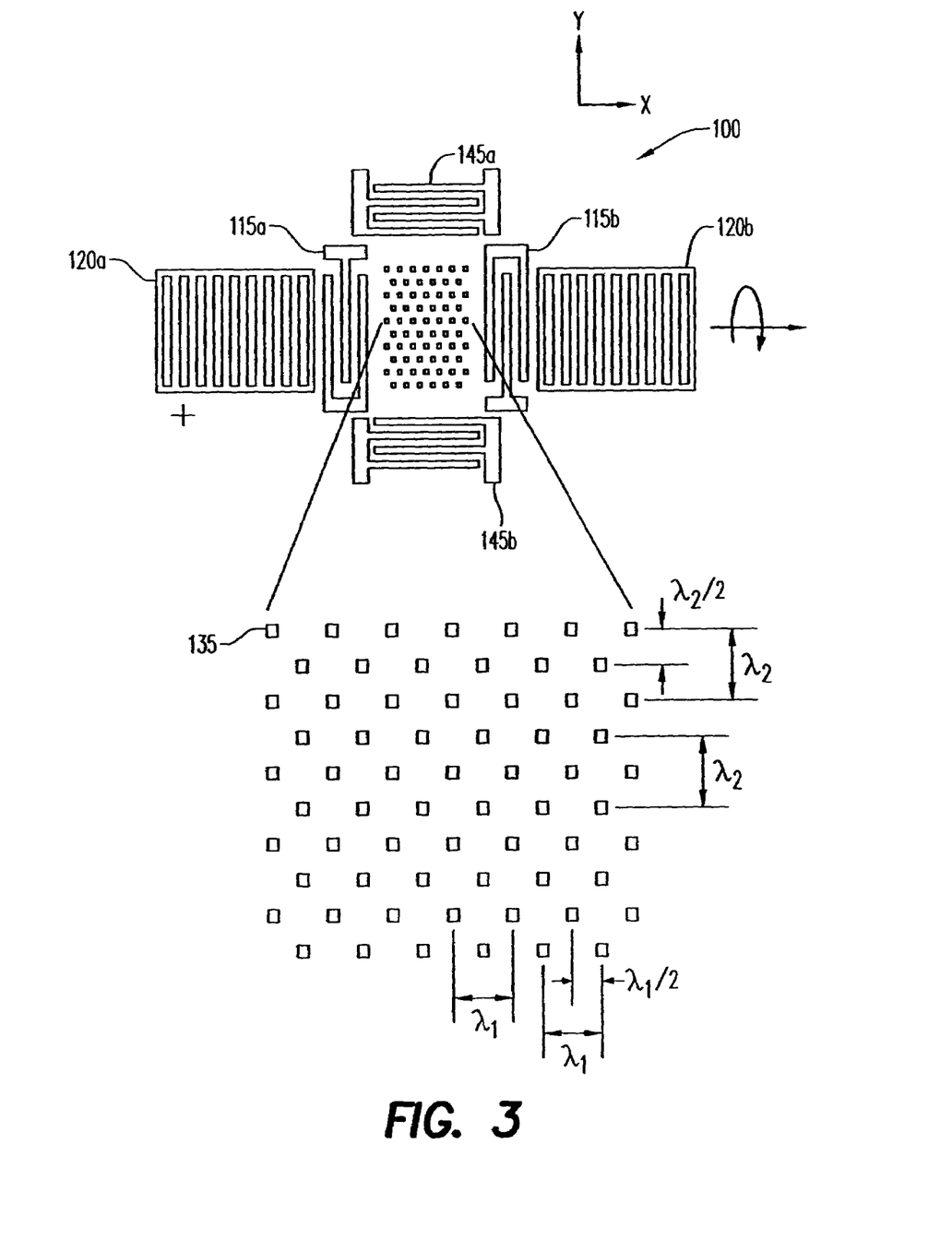
FIG. 3 is a diagram of a gyroscope according to the present invention, showing a detail of an arrangement of metallic dots thereon.

FIG. 3 is a simplified diagram of gyroscope 100, highlighting the spacing between, and the dimensions of, metallic dots 135. The metallic dots 135 are metal films of any metal, such as, for example, gold or aluminum. The metallic dots 135 are subjected to oscillatory motion due to the standing wave formed between reflectors 120($a,b$). Preferably, the metallic dots 135 do not affect the propagation of the standing wave. If the metallic dots 135 are too large or too heavy, they will interfere with the formation of the standing wave. Hence the size, position and thickness of metallic dots 135 are important. The shape of the individual metallic dots 135 is not critical, however, their relative positions are important.

The metallic dots 135 are arranged to avoid reflecting the first surface acoustic wave generated by resonator transducers 115($a,b$). Adjacent metallic dots 135 are spaced such that the first surface acoustic wave is not adversely affected by their presence. When gyroscope 100 is rotated, the Coriolis force acting on the metallic dots 135 produces a second surface acoustic wave. Preferably, the metallic dots 135 are also spaced such that the phases of the second acoustic wave are coherent and add to provide a strong signal to the sensor transducers 145($a,b$).

Assume that the metallic dots 135 lie in an x-y plane, in which the x-axis runs from one of the resonator transducers 115($a,b$) to the other, and the y-axis runs from one of the sensor transducers 145($a,b$) to the other. $\lambda_1$ is the surface acoustic wavelength in the x-direction, and $\lambda_2$ is the surface acoustic wavelength in the y-direction. The spacing between the metallic dots 135 in the x and y directions is different because the wavelengths $\lambda_1$ and $\lambda_2$ are different. The metallic dots 135 are spaced with a separation of $\lambda_1$ in the x-direction, and a separation of $\lambda_2$ in the y-direction. The size of the dots is preferably $\lambda_1/4$ in the x-direction and $\lambda_2/4$ in the y-direction. Note also that in the x and y directions, the dots are interlaced so that the second acoustic waves, generated by the Coriolis force, add coherently.

Figure 4:
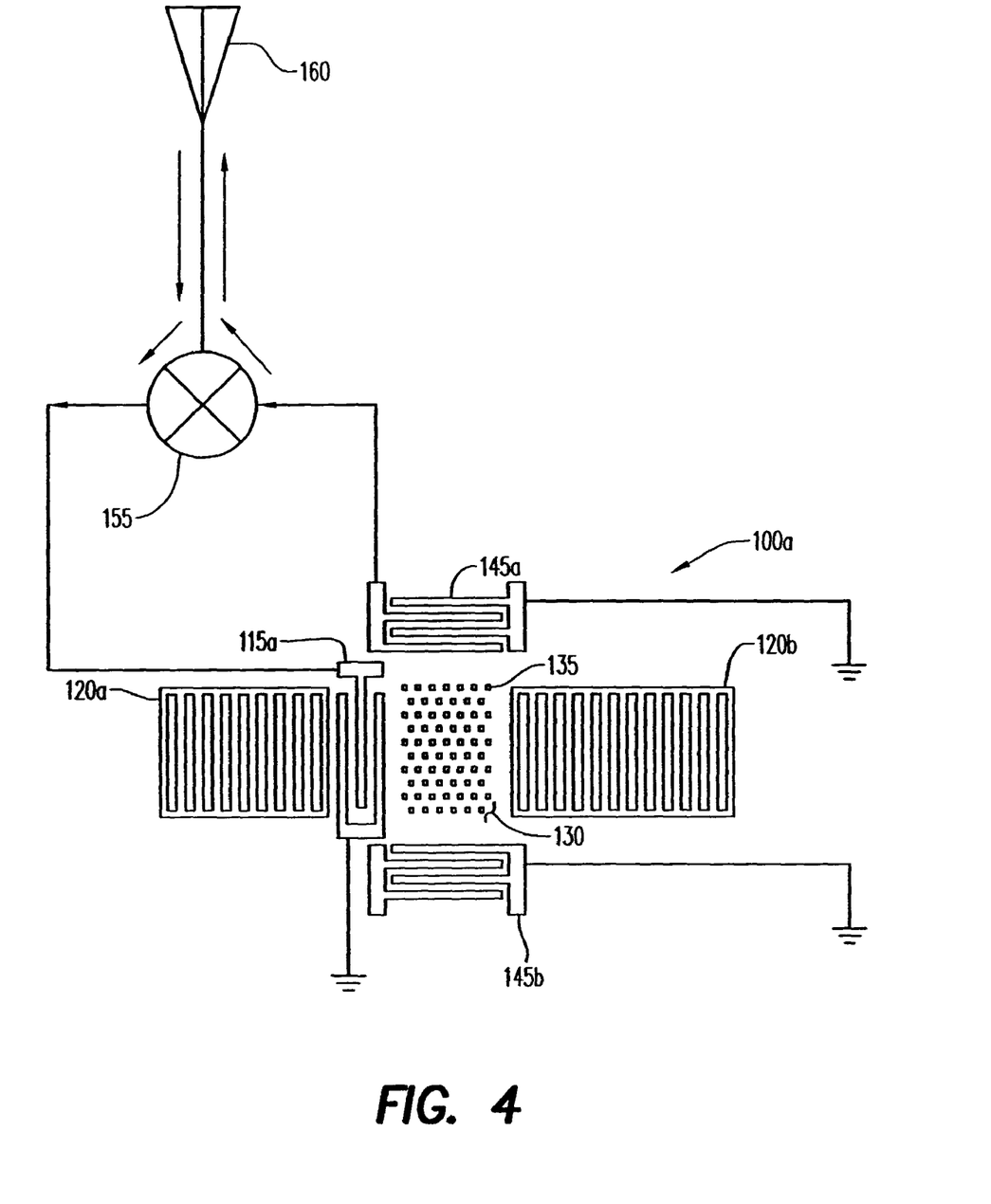
FIG. 4 is a diagram of a gyroscope according to the present invention, configured for wireless operation.

FIG. 4 is a schematic of a radio frequency (RF) wireless gyroscope 100$a$, which is a variation of gyroscope 100. Gyroscope 100$a$ is an integration of a SAWR and a SAWS arranged orthogonally to one another on a piezoelectric substrate (not shown). Gyroscope 100$a$ includes a resonator transducer 115$a$, a pair of reflectors 120($a,b$), and a sensor transducer 145$a$. Gyroscope 100$a$ is coupled to a microstrip duplexer 155, which is in turn coupled to an antenna 160.

The resonating transducer 115$a$ is disposed on a surface of the substrate for creating a first surface acoustic wave on the surface. The pair of reflectors 120($a,b$) is disposed on the surface for reflecting the first surface acoustic wave to form a standing wave within a region 130 of the surface between the pair of reflectors 120($a,b$). Together, the resonator transducer 115$a$ and the reflectors 120($a,b$) function as a SAWR.

A plurality of metallic dots 135, arranged in an array, is disposed on the substrate in region 130. The metallic dots 135 are subject to a reference vibration for detecting a Coriolis force. Assuming a 3-dimensional coordinate system in which an x-axis, a y-axis and a z-axis are orthogonal to one another, if the first surface acoustic wave causes a metallic dot 135 to oscillate along the z-axis, and the substrate is rotated about the x-axis, then the Coriolis force, which is related to the rate of rotation, is directed along the y-axis. Preferably, the array is located in the x-y plane such that the Coriolis force acting upon each of the plurality of metallic dots 135 creates a plurality of second surface acoustic waves that are coherently added.

The sensor transducer 145$a$ is disposed on surface 110 orthogonally to the resonator transducer 115$a$, for sensing the second surface acoustic wave and providing an output signal indicative of the characteristics of the second surface acoustic wave. The sensor transducer 145$a$ functions as a SAWS. A second sensor transducer 145$b$ can be included, which also provides an output signal indicative of the characteristics of the second surface acoustic wave. When the pair of sensor transducers 145($a,b$) are used together, their outputs are added together, thus improving the sensitivity of gyroscope 100$a$.

The microstrip duplexer 155 is an RF device having an input/output port to antenna 160, an output port to resonator transducer 115$a$, and an input port from sensor transducer 145$a$. Duplexer 155 allows an incoming signal from antenna 160 to pass only to the resonator transducer 115$a$ and prevents the incoming signal from passing to the sensor transducer 145$a$. Similarly, duplexer 155 allows an outgoing signal from the sensor transducer 145a to pass to the antenna 160, but does not permit a signal to flow from resonator transducer 115a to antenna 160.

Antenna 160 receives RF energy from an external source and couples the energy to duplexer 155. From duplexer 155, the RF energy is coupled to an input of the resonator transducer 115a. The resonator transducer 115a converts the energy to a first surface acoustic wave that propagates through an acoustic cavity, i.e., region 130. The first acoustic wave is reflected between reflectors 120(a,b), and thus a standing wave is formed in region 130.

The metallic dots 135 are located at anti-nodes of the standing wave and are subject to an oscillatory motion at the frequency of the standing wave. The oscillation of metallic dots 135 is used as a reference vibration. When gyroscope 100a is rotated, the Coriolis force causes a second surface acoustic wave to be generated at the same frequency as the standing wave.

The second surface acoustic wave propagates towards sensor transducer 145a. Sensor transducer 145a detects the second surface acoustic wave and produces a signal indicative thereof, which is coupled to duplexer 155, and from duplexer 155 to antenna 160. The signal is transmitted from antenna 160 after which it can be received and processed by external equipment.

Figure 5:
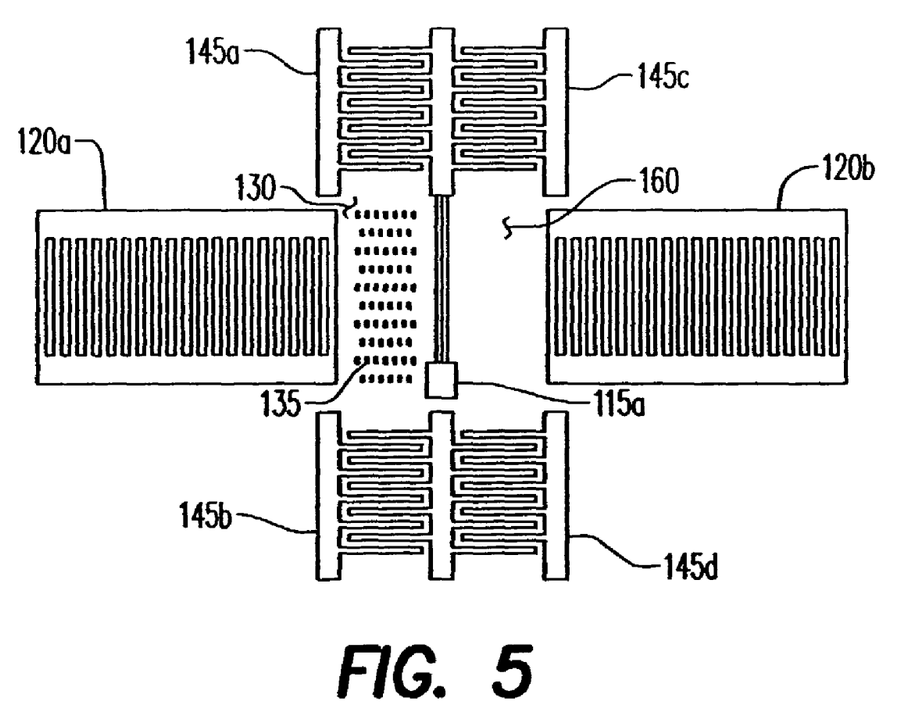
FIG. 5 is a diagram of a gyroscope according to the present invention, configured with a single resonator to provide a differential output.

FIG. 5 is a diagram of a gyroscope 100b according to the present invention, configured with a single resonator to provide a differential output. Gyroscope 100b is another variation of gyroscope 100. Gyroscope 100b includes a resonator transducer 115a, a pair of reflectors 120(a,b), a first pair of sensor transducers 145(a,b), and a second pair of sensor transducers 145(c,d). Gyroscope 100b also includes a region 130 within which a plurality of metallic dots 135 are located, and a region 160 that does not include metallic dots therein.

The resonator transducer 115a is located between the two reflectors 120(a,b), and the three components collectively function as a one-port resonator. An RF signal, for example 74.2 MHz, is applied to the resonator transducer 115a. The RF signal can be provided from a local source, as shown in FIG. 2, or via an antenna, as shown in FIG. 4. The RF signal excites resonator transducer 115a, thus generating a first SAW. The first SAW is reflected from reflectors 120(a,b) to form a standing wave in regions 130 and 160.

When gyroscope 100b is rotated, the metallic dots 135 in region 130 are subject to the influence of a Coriolis force, which will generate a second SAW. However, in region 160, which does not contain any metallic dots, there will be only a residual SAW, if any.

The four sensor transducers 145(a–d) are positioned orthogonally to the resonator transducer 115a. Sensor transducers 145(a,b), which are separated by region 130, sense the second SAW from region 130 and provide an output indicative of the characteristics of the second SAW. Sensor transducers 145(c,d), which are separated by region 160, sense the residual SAW from region 160 and provide an output indicative of the residual SAW.

The outputs of sensor transducers 145(a,b), representing the second SAW from region 130, which includes the metallic dots 135, are added together to serve as a test signal. Adding the signals from sensor transducers 145(a,b) improves the sensitivity of gyroscope 100b. The outputs of sensors 145(c,d), representing the residual SAW from region 160, which does not include the metallic dots, are added together to serve as a reference signal. The reference signal is subtracted from the test signal using a differential amplifier (not shown), to minimizes the effects of extraneous factors, such as external noise. The output of the differential amplifier is thus a more accurate representation of the second SAW from region 130 than that provided by sensor transducers 145(a,b) alone.

Figure 6:
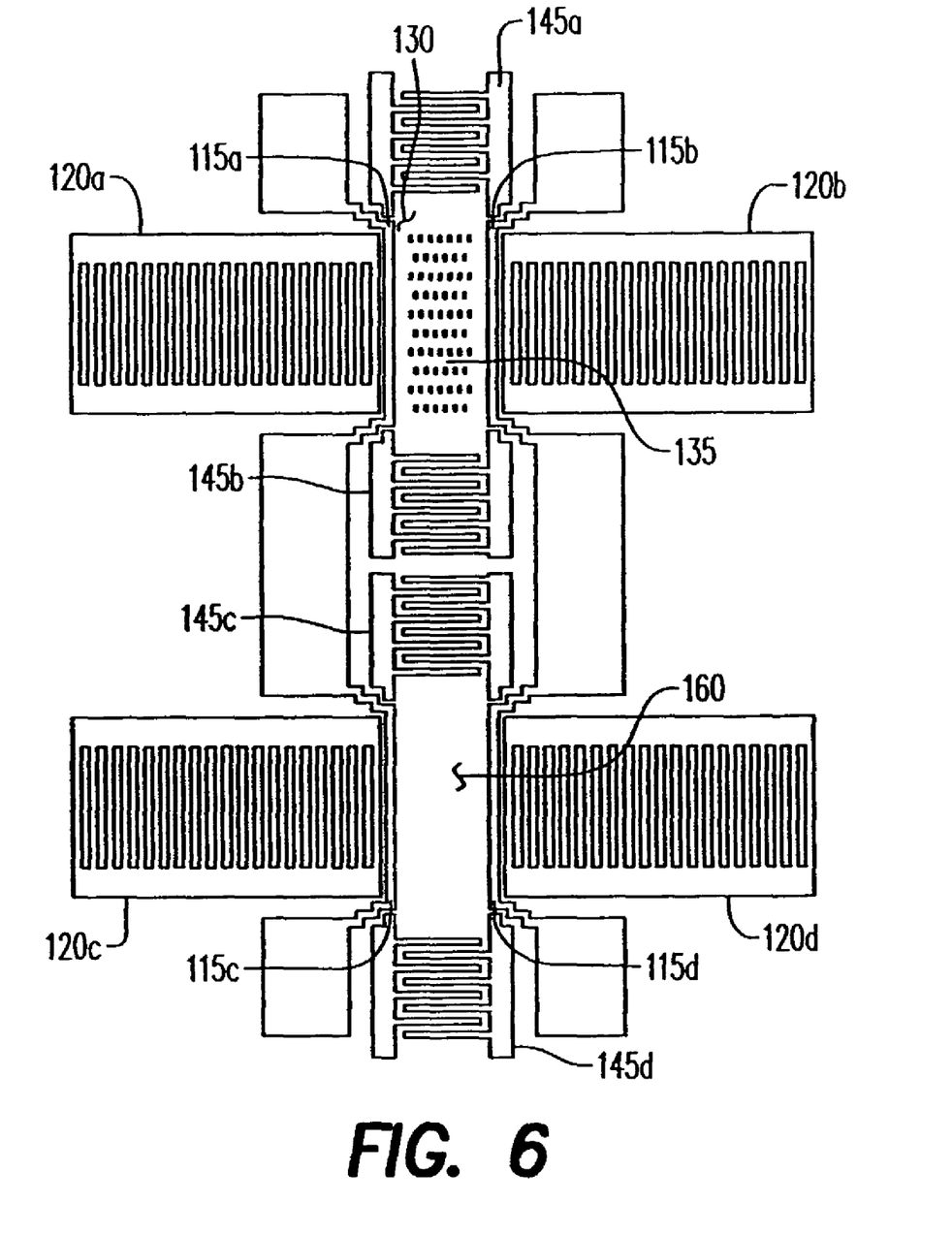
FIG. 6 is a diagram of a gyroscope according to the present invention, configured with two resonators to provide a differential output.

FIG. 6 is a diagram of a gyroscope 100c according to the present invention, configured with two resonators to provide a differential output. Gyroscope 100c is yet another variation of gyroscope 100. Gyroscope 100c includes a first pair of resonator transducers 115(a,b), a first pair of reflectors 120(a,b), a first pair of sensor transducers 145(a,b), and a region 130 within which a plurality of metallic dots 135 are located. Gyroscope 100c also includes a second pair of resonator transducers 115(c,d), a second pair of reflectors 120(c,d), a second pair of sensor transducers 145(c,d), and a region 160 that does not include metallic dots therein.

The resonator transducers 115(a,b) are located between the reflectors 120(a,b). An RF signal is applied to resonator transducers 115(a,b) to generate a first SAW. The first SAW is reflected from reflectors 120(a,b) to form a first standing wave, located in region 130. When gyroscope 100c is rotated, the metallic dots 135 in region 35 are subject to the influence of a Coriolis force, which will generate a second SAW.

Sensor transducers 145(a,b) are positioned orthogonally to resonator transducers 115(a,b). Sensor transducers 145(a, b), which are separated by region 130, sense the second SAW from region 130 and provide an output indicative of the characteristics of the second SAW.

The resonator transducers 115(c,d) are located between the reflectors 120(c,d). An RF signal is applied to resonator transducers 115(c,d) to generate a third SAW. The third SAW is reflected from reflectors 120(c,d) to form a second standing wave, located in region 160. Because region 160 does not include the metallic dots, when gyroscope 100c is rotated, only a residual SAW, if any, will be generated in region 160 as a result of the Coriolis force.

Sensor transducers 145(c,d) are positioned orthogonally to resonator transducers 115(c,d). Sensor transducers 145(c, d), which are separated by region 160, sense the residual SAW from region 160 and provide an output indicative of the residual SAW.

The outputs of sensor transducers 145(a,b), representing the second SAW from region 130, which includes the metallic dots 135, are added together to serve as a test signal. Adding the signals from sensor transducers 145(a,b) improves the sensitivity of gyroscope 100c. The outputs of sensors 145(c,d), representing the residual SAW from region 160, which does not include the metallic dots, are added together to serve as a reference signal. The reference signal is subtracted from the test signal using a differential amplifier (not shown), to minimizes the effects of extraneous factors, such as external noise. The output of the differential amplifier is thus a more accurate representation of the second SAW from region 130 than that provided by sensor transducers 145(a,b) alone.

FIG. 7 is a simplified diagram of gyroscope 100 with exemplary dimensions given below in micrometers ($\mu$m). These dimensions are also appropriate for use with gyroscopes 100(a–c), discussed above. Gyroscope 100, as represented in FIG. 7, includes a pair of resonator transducers 115(a,b), a pair of reflectors 120(a,b), and a pair of sensor transducers 145(a,b). The resonator transducers 115(a,b), which are part of a SAWR, are also conventionally referred to as resonator IDTs. The sensor transducers 145(a,b), which function as a SAWS, are also referred to as sensor IDTs.

$\lambda_1 = 52$ $\mu$m=acoustic wavelength in the x-direction $\lambda_2 = 48$ $\mu$m=acoustic wavelength in the y-direction SAWR finger width ($\lambda_1/4$)=13 μm
SAWR finger spacing ($\lambda_1/4$)=13 μm
SAWS finger width ($\lambda_2/4$)=12 μm
SAWS finger spacing ($\lambda_2/4$)=12 μm
Number of resonator IDT fingers=7
Number of sensor IDT fingers=40
Number of reflectors (individual gratings) per side=199
Thickness of metallization=0.12 μm
A=reflector length=5174 μm
B=spacing between reflectors=102*($\lambda_1/4$)=1326 μm
C=spacing between bus bars of sensor IDT=1321.5 μm
D=aperture of sensor IDT=1213.5 μm
E=bus bar width=260 μm
F=spacing between reflector and resonator IDT=5*($\lambda_1/8$)= 32.5 μm
G=spacing between reflector bus bar=2600 μm
H=reflector height=3120 μm
I=aperture of resonator IDT=192*($\lambda_1/4$)=2496 μm
J=spacing between bus bars of resonator IDT=2600 μm
K=spacing between resonator IDTs=71*($\lambda_1/4$)=923 μm
L=spacing between sensor IDTs=268*($\lambda_2/4$)=3216 μm The specifics of the size and spacings of the metallic dots 135 (not shown in FIG. 7) can be found in FIG. 3.

It is important to know characteristics of impedance, admittance, bandwidth and sensitivity of the sensor transducers 145(*a,b*) at the operating frequency of the resonator transducers 115(*a,b*) and reflectors 120(*a,b*), because the sensor transducers 145(*a,b*) are designed to efficiently detect the SAW waves generated from the Coriolis force. It is assumed that the optimal design of the resonator transducers 115(*a,b*), reflectors 120(*a,b*) and sensor transducers 145(*a,b*) will provide an efficient gyroscope if the effect of the array of metallic dots 135 on the resonator is minimal. Thus, it is important to know the resonator characteristics in the presence of metallic dot array within the cavity space.

The sensor transducers 145(*a,b*) of gyroscope 100, which are positioned perpendicular to the resonator transducers 115(*a,b*), are preferably designed through the typical SAW filter transfer function computation. By writing out the admittance components as shown below, the frequency response of the sensor transducers 145(*a,b*) can be obtained from the transfer function A.

The radiation conductance and susceptance of a SAWS can be found as $$G_a = 8N_p^2 K^2 f_o C_s \left| \frac{\sin\left[N_p \pi \frac{(f-f_o)}{f_o}\right]}{N_p \pi \frac{(f-f_o)}{f_o}} \right|^2 \quad (1)$$

$$B_a = 8N_p^2 K^2 f_o C_s \left| \frac{\sin\left[N_p \pi \frac{(f-f_o)}{f_o}\right] - \left[N_p \pi \frac{(f-f_o)}{f_o}\right]}{\left[N_p \pi \frac{(f-f_o)}{f_o}\right]^2} \right| \quad (2)$$

where $N_p$ is the number of fingers in the IDT, K⁻ is the coupling coefficient, and $C_s$ is capacitance per finger pair.

The input and output admittance of the IDT are given by $$y_{11} = G_a + i \cdot (B_a + \omega \cdot ('_1)) \text{ for } \omega \neq \omega_o \quad (3)$$

$$y_{11} = G_a + i \cdot (\omega \cdot C_1) \text{ for } \omega = \omega_o \quad (4)$$

where $C_T$ is total capacitance of the IDT.

The transfer admittance can be as follows $$y_{ij} = G_o \cdot N \cdot M \cdot e^{-i\omega \tau_o} \text{ for } \omega = \omega_o \quad (5)$$

$$y_{ij} = G_o \cdot N \cdot M \cdot \frac{\sin\left(\frac{\pi \cdot N \cdot (\omega - \omega_o)}{2 \cdot \omega_o}\right)}{\frac{\pi \cdot N \cdot (\omega - \omega_o)}{2 \cdot \omega_o}} \cdot \frac{\sin\left(\frac{\pi \cdot M \cdot (\omega - \omega_o)}{2 \cdot \omega_o}\right)}{\frac{\pi \cdot M \cdot (\omega - \omega_o)}{2 \cdot \omega_o}} \cdot e^{-i\omega \tau_o} \quad (6)$$

for $\omega \neq \omega_o$ where N and M are the number of finger pairs in the sensor IDTs 145(*a,b*).

Then, the transfer function is given as $$A = \frac{(y_1 + y_2)y_{12}}{y_{12}^2 - (y_1 + y_{11}) - (y_2 + y_{22})} \quad (7)$$

where $y_1$ and $y_2$ are the source and load admittance. $y_{11}$, $y_{12}$, and $y_{22}$ are the input, transfer, and output admittances of the IDT, respectively.

A two-port resonator can be represented in terms of its component matrices as shown below. The G matrix represents SAW reflectors, τ matrix represents the relation between electric and acoustic parameters and D matrix represents the acoustic space between IDTs and reflectors. The boundary conditions can be applied assuming there are no incoming waves from the outsides of reflectors and assuming the impedance of resonator transducers is matched at electrical terminals. Then, the first order response of two-port resonator can be obtained by solving the following equations. By way of example, and referring to FIG. 7, $D_2$ is F, $D_4$ is K and $D_6$ is F.

$$[M] = [G_1][D_2][\tau_3][D_4][\tau_5][D_6][G_7] \quad (8)$$

By applying the ideal boundary conditions mentioned above, $$\begin{Bmatrix} 0 \\ w_0^- \end{Bmatrix} = [M] \begin{Bmatrix} w_7^+ \\ 0 \end{Bmatrix} + a_3[G_1][D_2][\tau_3] \quad (9)$$

For numerical simulation, one pair of resonator transducers is considered an input and the other pair of resonator transducers is considered an output. At the output IDT, $$[W_5] = [D_6][G_7][W_7] \quad (10)$$

Then, output voltage from the IDT is given by $$V_{out} = b_5 = [\tau'][W_5] \quad (11)$$

Figure 8:
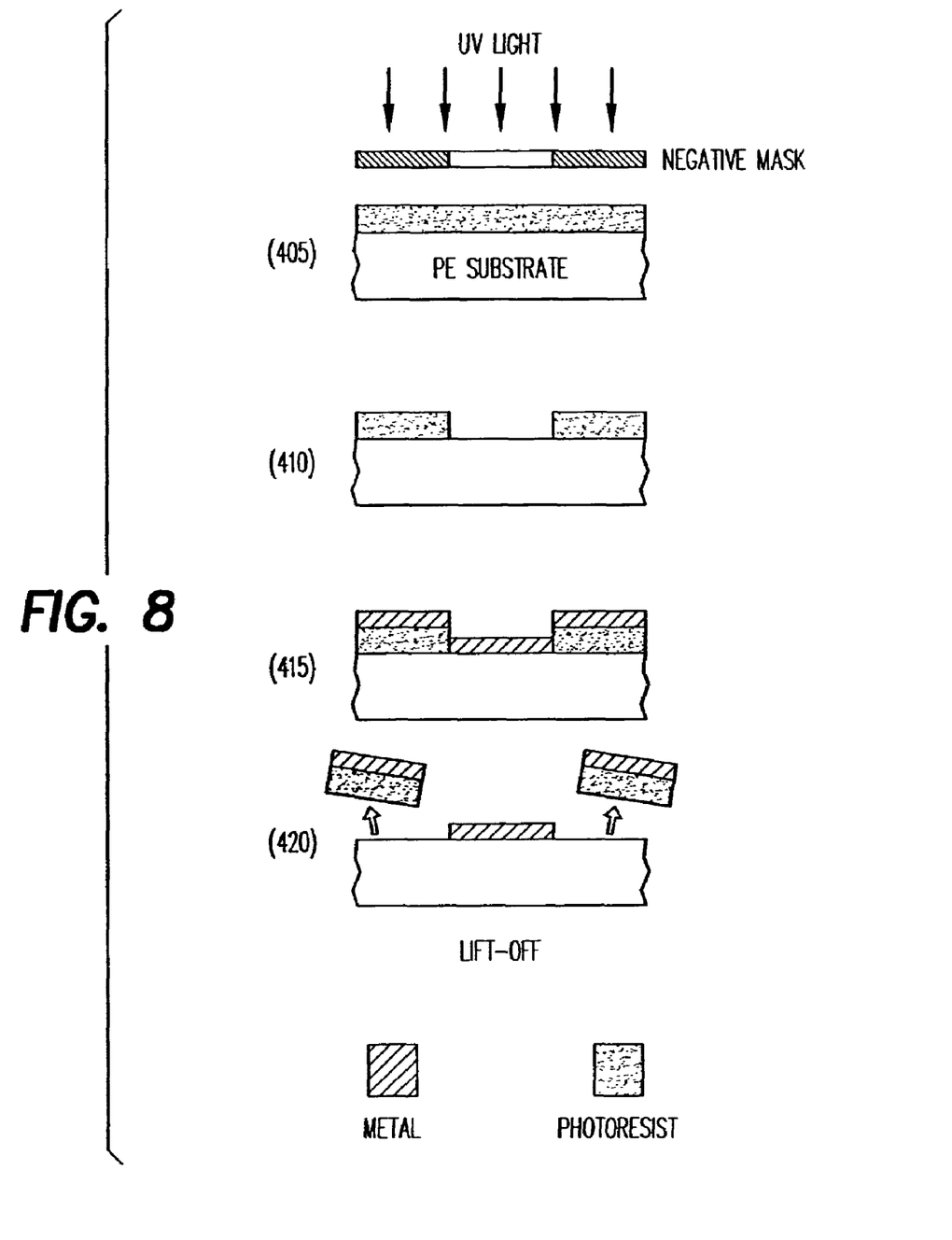
FIG. 8 is a diagram showing the steps of a method for manufacturing a micro-electro-mechanical gyroscope by using a lift-off technique.
Figure 9:
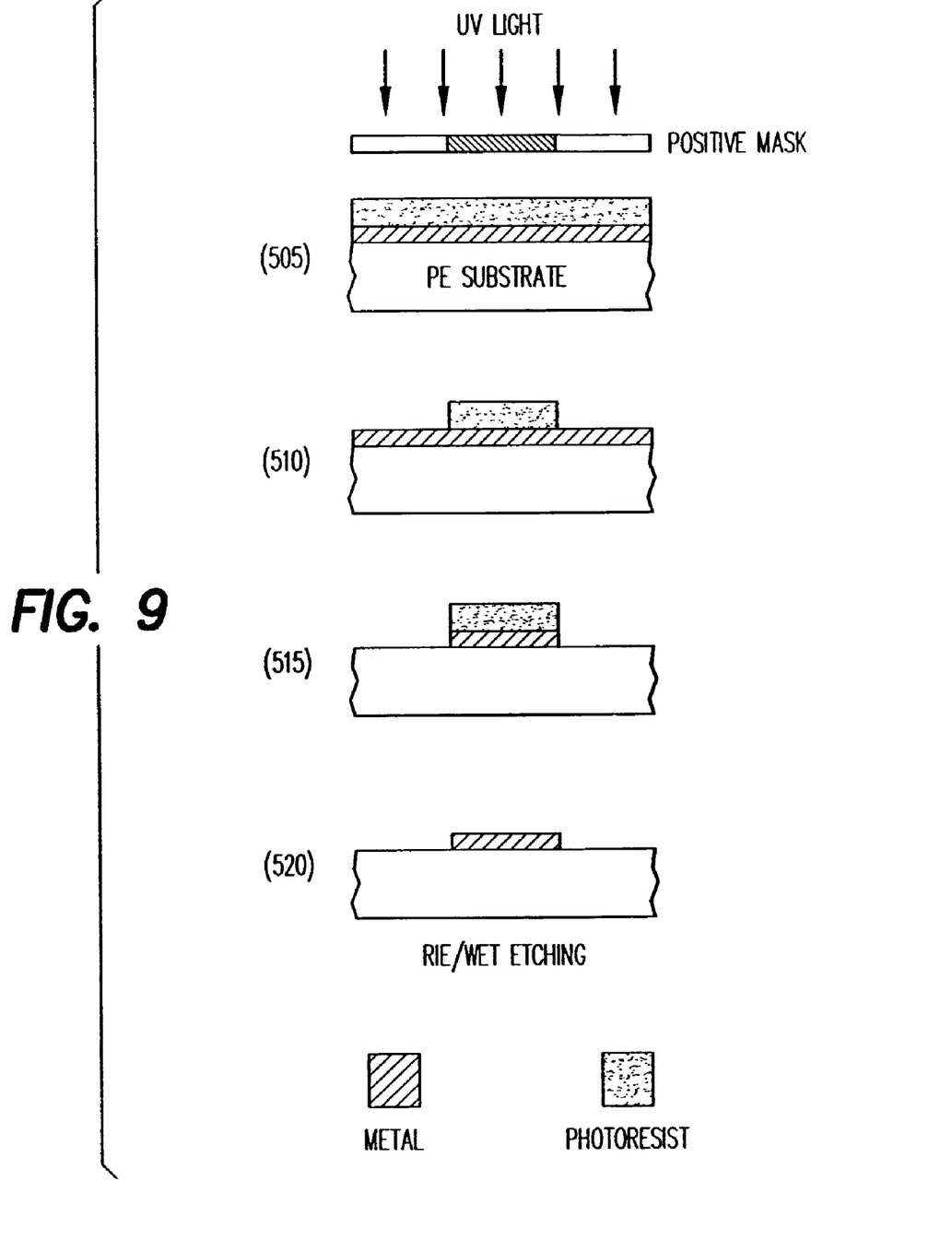
FIG. 9 is a diagram showing the steps of a method for manufacturing a micro-electro-mechanical gyroscope by using a reactive ion etching technique.

The gyroscope 100 is fabricated as an integrated circuit using either a liftoff technique or a reactive ion etching (RIE) technique. In either case, the fabrication method includes the steps of providing a piezoelectric substrate, forming a pattern having a plurality of apertures therethrough, and fabricating, using the pattern, a plurality of features on the substrate. The features include a pair of resonator transducers for creating a first surface acoustic wave on the surface; a pair of reflectors for reflecting the first surface acoustic wave to form a standing wave within a region of the surface between said pair of reflectors; a structure within the region, wherein a Coriolis force acting upon the structure creates a second surface acoustic wave; and a pair of sensor transducers separated from one another by the region and disposed orthogonally to the pair of reflectors, for sensing the second surface acoustic wave.

FIG. 8 illustrates the steps performed in a method for manufacturing a gyroscope using the liftoff technique.

In step 405, fabrication begins with standard photolithography using standard equipment such as a wet bench, resist spinner, hotplates and an evaporator. The lithium niobate wafers are cleaned using acetone, isopropanol and trichloroetylene, in turn, at about 60° C. for about 10 minutes. The wafers are then thoroughly rinsed in de-ionized (DI) water for about 5 minutes and subsequently heated at 125° C. on a hot plate for about 10 minutes to remove surface moisture. Upon cooling the wafer on a heat sinking plate, photoresist is then spin coated at 4000 rpm for 55 seconds on the wafer after soaking the top face with hexamethyldisilazane (HMDS), which is an adhesion agent. The wafer is then heated at 125° C. for 2 minutes in what is commonly referred to as the soft-bake. A negative mask is set in place over the photoresist. The negative mask is a template defining the regions of the substrate upon which metal will not remain. The wafer is then exposed to UV light (of 15 mW/cm$^2$) for 1.2 seconds such that the regions of the resist that are exposed become soluble to the developer (DI water and MF312 in a 1:1 ratio). The method then advances to step 410.

In step 410, a pattern is formed having a plurality of apertures therethrough. The wafer is soaked in photoresist and developed until the sections that have been exposed to UV light, and are therefore soluble, are etched away. The wafer is then hard-baked at 125° C. for 1 min 30 seconds. The method then advances to step 415.

In step 415, a layer of metal is deposited on the wafer forming a designed pattern and through the apertures that are etched away. More particularly, the patterned wafer is coated with 0.02 $\mu$m of chromium, to improve adhesion of gold to the LiNbO$_3$ substrate, using e-gun evaporation and immediately coated with 0.12 $\mu$m or gold using thermal evaporation. The method then advances to step 420.

In step 420, the wafer is submerged into acetone to facilitate liftoff of the pattern, thereby leaving the metal deposited through the apertures to define the features.

The liftoff technique is adequate for a 74.2 MHz gyroscope that has a minimum feature size of about 6$\mu$m. In order to obtain a higher frequency gyroscope (200 MHz–915 MHz), the small feature sizes (<4 $\mu$m) of the electrodes makes it necessary for fabrication using a different process, such as RIE.

FIG. 9 illustrates the steps performed in a method for manufacturing gyroscope 100 using the RIE technique.

In step 505, the wafers are metallized, that is, a layer of metal is deposited on the surface of the piezoelectric substrate. A layer of photoresist is then deposited over the layer of metal. The RIE technique employs a positive mask that defines the regions on the surface of the substrate upon which metal will remain. The wafer is irradiated with UV light and the regions of the resist that are exposed become soluble. The method then advances to step 510.

In step 510, the soluble regions of the photoresist are removed to form a pattern having a plurality of apertures therethrough. The method then advances to step 515.

In step 515, the layer of metal exposed within the apertures is selectively removed by reactive ion etching. The remaining metal defines the features of the gyroscope. The method then advances to step 520.

In step 520, the pattern is removed.

For the RIE technique, the patterned wafer is loaded into the loading chamber of an RIE device, such as a Plasma Therm™ machine with a load-lock facility, to safeguard the reaction chamber against environmental contamination and corrosion, and is pumped down to 1×10$^{-5}$ Torr. The wafer is then subjected to a pre-etch evacuation and purging with N$_2$ at 100 mTorr. The gases CF$_-$, Cl$_2$, and O$_2$ for etching the gold are then admitted into the chamber in what is known as the gas stabilization step. The etching of gold proceeds using 300W of RF power at 10 mTorr pressure. The etch durations depend on the device patterns on the wafer. After the gold etch, the etchant gases are stabilized once again and for the subsequent etching of the underlying chrome layer. The gases used are Cl$_2$, and O$_2$ using 120W of RF power at 40 mTorr for about half the duration of the gold etch. After post etch evacuation and purging, the wafers are unloaded and the photoresist stripped using acetone in an ultrasonic agitator.

For wet etching of gold, a solution of Techigoldstrip™ can be used. It contains potassium iodide (KI) among other proprietary chemicals. The gold is etched using a combination of Techigoldstrip™ and de-ionized water. The etching is performed every 10 seconds and examined under the microscope to safeguard against over etching of the pattern. After etching the gold, the underlying chromium layer is etched using a solution of ammonium ceric nitrate (27.4 g of (NH4)2Ce(NO3)6), phrchloric acid (21.5 ml of 70% HCLO4) and de-ionized water.

The gyroscope is preferably not hermetically sealed at the first instance. Instead, active laser trimming is employed to attaining a desired precision. This technique enables specific parameter values to be realized by trimming the film components, while the circuit is under power. The IDT fingers are selectively cut to achieve a desired frequency specification because the fabrication, as well as hermetic packaging, may alter the design frequency. The material is completely vaporized, leaving a clean-edge in width. The typical active-trim includes, matching, offset adjustments and frequency tuning. The high-resolution laser trimming can achieve frequency resolution of the order of parts per million.

A gyroscope in accordance with the present invention is suitable for employment in a variety of applications, some examples of which are listed in the following paragraphs.

(A) Commercial products: Anti-skid applications for automobiles, 3D mouse for virtual games, wireless mouse, global positioning system (GPS) assisted navigation for land, sea and aerial vehicles, automobile roll-over control.

(B) Industrial applications: Automatic control of machines and robots, control of medical products like wheel chair movement, precise movement of surgical tools, monitoring of body parts.

(C) Military applications: Including, but not limited to, aircraft, missile, helicopter, ship and land navigation systems.

Three orthogonally disposed gyroscopes 100 in a package of 1 cm×1 cm×1 cm size, can provide angular rate information for 3 axes. With this size device, precise platform stabilization can be accomplished for a variety of applications as mentioned above. In addition to the applications discussed above, the advent of GPS has resulted in a demand of very precise, compact and accurate control instruments for pin-point tracking, and motion control of targets. The gyroscope of the present invention is well suited to fulfill these needs. It is also very attractive for use in space and underwater applications because for such applications, small vibrations cause acoustic or mechanical noise in other sensor systems. The gyroscope is immune to acoustic and mechanical noise because it does not involve any moving parts.

It should be understood that various alternatives and modifications can be devised by those skilled in the art. The present invention is intended to embrace all such alternatives, modifications and variances that fall within the scope of the appended claims.

What is claimed is:

1. A method for manufacturing a micro-electro-mechanical gyroscope, comprising:
   providing a piezoelectric substrate;
   forming a pattern having a plurality of apertures therethrough; and
   fabricating, using said pattern, a plurality of features on said substrate, said features comprising:
   a resonator transducer for creating a first surface acoustic wave on said surface;
   a pair of reflectors for reflecting said first surface acoustic wave to form a standing wave within a first region of said surface between said pair of reflectors;
   a structure within said region, wherein a Coriolis force acting upon said structure creates a second surface acoustic wave; and
   a first sensor transducer disposed on said surface for sensing said second surface acoustic wave; and
   a second sensor transducer disposed on said surface for sensing a residual surface acoustic wave from a second region of said surface that is free of any structure that said Coriolis force can act upon, and for providing an output indicative of said residual surface acoustic wave.

2. The method of claim 1, wherein said step of fabricating comprises the steps of:
   depositing a layer of metal on said pattern and through said apertures; and
   lifting off said pattern, thereby leaving said metal deposited through said apertures to define said features.

3. The method of claim 1,
   wherein said step of forming said pattern comprises a preliminary step of depositing a layer of metal on said surface, and
   wherein said step of fabricating comprises the steps of selectively removing said layer of metal exposed within said apertures to define said features, and removing said pattern.

4. The method of claim 3, wherein said step of selectively removing comprises a step of etching.

5. The method of claim 4, wherein said step of etching comprises a step of reactive ion etching.

* * * * *